(12) United States Patent
Hsu et al.

(10) Patent No.: US 8,031,810 B1
(45) Date of Patent: *Oct. 4, 2011

(54) ADC ARCHITECTURE FOR WIRELESS APPLICATIONS

(75) Inventors: Yungping Hsu, Saratoga, CA (US); Mao Yu, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 12/945,035

(22) Filed: Nov. 12, 2010

Related U.S. Application Data

(63) Continuation of application No. 12/150,832, filed on May 1, 2008, now Pat. No. 7,835,465, which is a continuation of application No. 10/170,306, filed on Jun. 12, 2002, now Pat. No. 7,388,931.

(51) Int. Cl.
*H03K 9/00* (2006.01)
*H03M 1/00* (2006.01)

(52) U.S. Cl. ........ 375/316; 375/324; 375/340; 375/349; 375/350; 375/351; 375/354; 375/377; 341/126; 341/141; 341/155; 708/313

(58) Field of Classification Search .......... 375/316, 375/324, 342, 30, 355, 340, 349–351, 354, 375/377; 341/126, 141, 155; 708/313
See application file for complete search history.

(56) References Cited

U.S. PATENT DOCUMENTS

| | | | |
|---|---|---|---|
| 4,878,029 A | 10/1989 | Saulnier et al. | |
| 5,142,553 A | 8/1992 | Rosenkranz | |
| 5,229,771 A | 7/1993 | Hanlon | |
| 5,381,446 A * | 1/1995 | McIntosh | 375/150 |
| 5,508,695 A | 4/1996 | Nelson et al. | |
| 5,510,737 A * | 4/1996 | Arvidsson | 327/91 |
| 5,550,869 A * | 8/1996 | Gurantz et al. | 375/340 |
| 5,594,445 A | 1/1997 | Ginetti | |
| 5,625,359 A | 4/1997 | Wilson et al. | |
| 5,641,931 A | 6/1997 | Ogai et al. | |
| 5,786,782 A | 7/1998 | Ostman et al. | |
| 5,912,921 A | 6/1999 | Warren et al. | |
| 5,982,807 A | 11/1999 | Snell | |
| 6,032,028 A * | 2/2000 | Dickey et al. | 455/110 |
| 6,166,675 A | 12/2000 | Bright | |
| 6,169,504 B1 | 1/2001 | Park | |
| 6,192,026 B1 | 2/2001 | Pollack et al. | |
| 6,282,248 B1 * | 8/2001 | Farrow et al. | 375/324 |
| 6,310,571 B1 | 10/2001 | Yang et al. | |
| 6,313,882 B1 | 11/2001 | Limberg et al. | |
| 6,545,626 B1 | 4/2003 | Nakada | |
| 6,735,422 B1 | 5/2004 | Baldwin et al. | |
| 6,765,623 B1 | 7/2004 | Parker | |
| 7,139,332 B2 * | 11/2006 | Yu et al. | 375/316 |
| 7,313,198 B2 | 12/2007 | Rahman et al. | |

(Continued)

OTHER PUBLICATIONS

ANSI/IEEE Std 802.11, 1999 Edition, Sponsor LAN MAN Standards Committee of IEEE Computer Society, "Part 11: Wireless LAN Medium Access Control (MAC) and Physical Layer (PHY) Specifications," Ch. 12 (pp. 138-146), Ch. 13 (pp. 147), Ch. 15 (pp. 195-223).

(Continued)

*Primary Examiner* — Chieh M Fan
*Assistant Examiner* — Sophia Vlahos

(57) ABSTRACT

An architecture for use in wireless receiver applications, particularly for ADC conversion of received in-phase I and quadrature Q signals. A single ADC is shared to convert both signals, and the ADC input is alternately switched between the i and q signals. In an embodiment, the ADC is clocked at an increased sample rate, and the digital output signals are aligned to compensate for the phase difference resulting from the implementation of the single ADC.

12 Claims, 7 Drawing Sheets

U.S. PATENT DOCUMENTS

| | | | |
|---|---|---|---|
| 7,596,189 B2* | 9/2009 | Yu et al. | 375/316 |
| 2001/0030619 A1 | 10/2001 | Jonsson et al. | |
| 2003/0009772 A1 | 1/2003 | Karr | |
| 2003/0215027 A1 | 11/2003 | Yu et al. | |

OTHER PUBLICATIONS

IEEE Std 802.11 b-1999, Sponsor LAN MAN Standards Committee of IEEE Computer Society, "Part 11: Wireless LAN Medium Access Control (MAC) and Physical Layer (PHY) Specifications, Higher-Speed Physical Layer Extension in 2.4 GHz Band," Ch. 18 (pp. 11-58).

IEEE Std 802.11 a-1999, Sponsor LAN MAN Standards Committee of IEEE Computer Society, "Part 11: Wireless LAN Medium Access Control (MAC) and Physical Layer (PHY) Specifications, High-Speed Physical Layer in the 5 GHz Band".

Understanding Pipelined ADCs Maxim Dallas Semiconductors, Mar. 1, 2001.

* cited by examiner

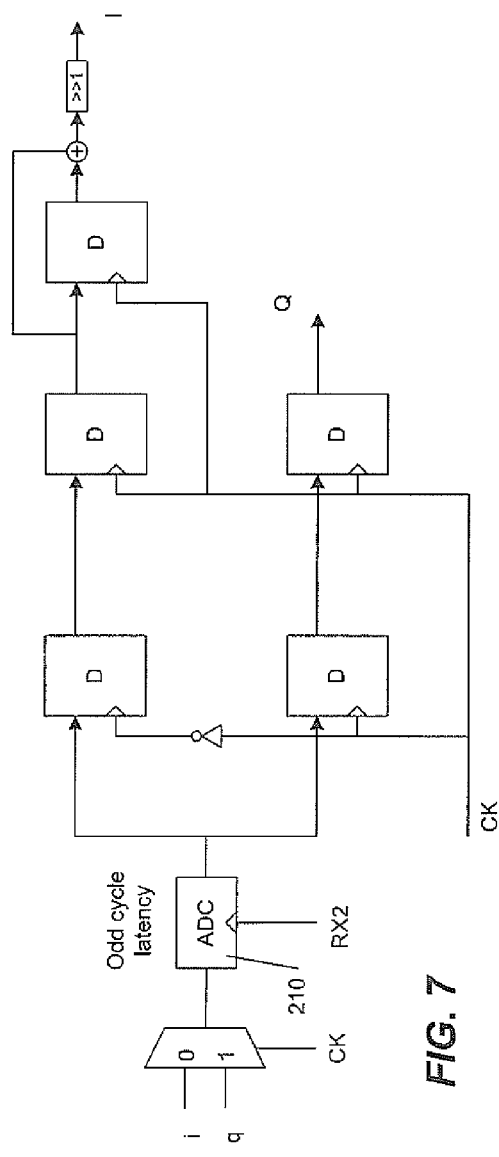
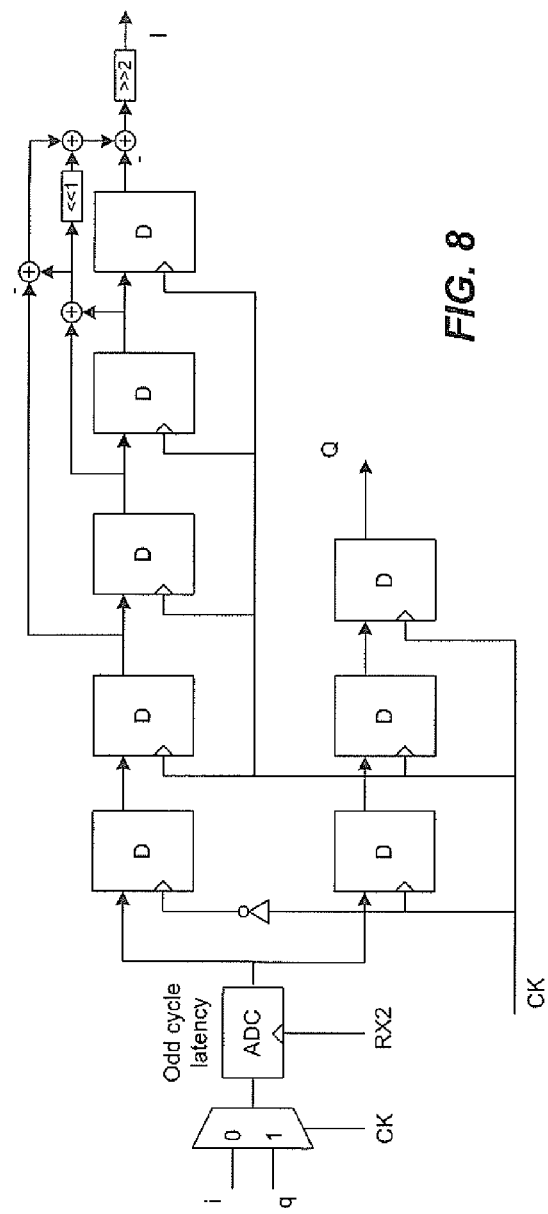

ically, 44
ADC ARCHITECTURE FOR WIRELESS APPLICATIONS

CROSS-REFERENCE TO RELATED APPLICATIONS

This application is a continuation of U.S. application Ser. No. 12/150,832, filed on May 1, 2008, which is a continuation of U.S. Pat. No. 7,388,931, filed on Jun. 12, 2002, the disclosures of which are incorporated by reference herein.

TECHNICAL FIELD

This invention pertains to wireless communications and, more specifically, to improved methods and apparatus for analog to digital conversion in a voice and/or data communication receiver.

BACKGROUND OF THE INVENTION

Most wireless receiver circuits employ similar architectures. On the transmitter side (not shown), digital user data (which may be encoded or sampled voice data) is input to a bit-symbol encoder, which may be implemented as a dedicated circuit or a combination of hardware and software (such as a DSP). In any event, the bit-symbol encoder typically splits the data into two half-rate streams. These streams are modulated onto a pair of orthogonal carriers, called I and Q for in-phase and quadrature-phase carriers respectively, although other modulation schemes are known. This is a 2-D (or two-dimensional) transmission scheme. The I and Q signals are combined for transmission over an RE channel as is well known in the art.

Referring now to FIG. 1, a typical wireless receiver circuit 10 has an RF antenna 12 to receive an incident RF signal. The RF signal from the antenna may be subjected to a band preselect filter (not shown), and typically is input to a low-noise amplifier 14 (LNA). The filtered, amplified RF signal is input to a first mixer 16, to bring the RF signal down to a selected intermediate frequency (IF). Mixer 16 is driven by a first local oscillator signal LO1 applying techniques that are well known in the radio prior art.

An IF amplifier 18 and/or low pass filter (not shown) further conditions the signal, which is then split into two paths. The IF signal is input to a second mixer 20 and also input to a third mixer 24. The second mixer 20 is driven by a second local oscillator signal LO2, arranged to recover or demodulate the in-phase baseband analog signal "i". The local oscillator signal LO2 is also input to a 90-degree delay or phase shifter 22, the output of which drives the third mixer 24. The IF signal is input to the third mixer as illustrated, so that the third mixer 24 demodulates the quadrature-phase orthogonal baseband analog signal "q". In this description, we use lower case "i" and "q" to refer to the analog signals corresponding to the I and Q digital data streams, respectively.

Next the in-phase analog signal "i" is input to a low pass filter 30, and then to a buffer 32. The buffered signal is input to an analog-to-digital converter circuit ("ADC") 34 for conversion into digital data. This stage recovers, at node 35, one of the pair of half-rate data streams originally encoded in the transmitter.

Similarly, the quadrature phase signal "q" recovered by the third mixer 24 is filtered in LPF 40 and buffer 42. The resulting analog signal is input to a second analog to digital converter circuit 44 (ADC) for conversion into digital data. This stage recovers, at node 45, the other one of the pair of half-rate data streams originally encoded in the transmitter. Both ADC's are driven by a common receive clock signal 48 ("RX clock"), which may have a frequency of, for example, 44 MHz. The two ADCs are thus synchronized; they operated on the i and q signals in parallel. The recovered digital data streams are further processed in a pair of FIR low-pass filters LPF 36, 46 respectively. The two digital streams are then further processed by other functional blocks such as a complex equalizer and correlators as is known in the art.

Various ADC circuits are known that could be used in this architecture. They include the conventional feedback-type ADC, which is small but slow. U.S. Pat. No. 5,229,771 to Hanlon describes an integrating type of ADC circuit in which switches, like multiplexers, are used to select various reference voltages Vref+, Vref– and trip voltages Vtrip(n) etc. for use in the integration stage of the ADC; but that system still converts only a single analog input signal Vin during a cycle.

A faster approach is realized in a parallel or "flash" ADC. A flash ADC incorporates a plurality of comparators arranged in parallel, so as to form the N-bit digital output signal in a single cycle. U.S. Pat. No. 6,169,504 describes the use of interleaved sampling for faster conversion in the context of a parallel series of comparators. Improved accuracy can be obtained by using pipelined ADC circuits. These too are known, as described for example in U.S. Pat. No. 6,166,675.

One significant drawback of the receiver architecture summarized above is related to the pair of ADC circuits. Mismatches in the internal comparators of the ADCs must be carefully controlled to minimize errors. Especially in pipelined converter designs, offset, gain errors and other imperfections in the ADC circuits add to their complexity. See U.S. Pat. No. 5,594,445. Consequently, high performance ADC circuits are expensive both in terms of chip area and power consumption. These factors are of paramount importance in integrated circuit designs for portable applications such as cell phones, pagers and other wireless communication equipment.

Accordingly, it would be advantageous to reduce the amount of chip area that must be dedicated to ADC circuits in a receiver. It would also be advantageous to reduce the number of ADC circuits required in a receiver, without sacrificing speed or accuracy of received data recovery.

SUMMARY OF THE INVENTION

One aspect of the present invention is an improved baseband circuit for use in connection with an RF receiver for wireless communication of data. The new baseband circuit provides a substantial reduction in circuit area and power consumption by reducing the number of ADC circuits necessary for conversion of analog data streams. According to one embodiment, the receiver provides "i" and "q" orthogonal analog signals from corresponding demodulators. These two signals are converted to digital data in a single, shared ADC circuit, thereby substantially reducing circuit size and power.

Another aspect of the invention provides a method for concurrently converting a pair of orthogonal signals into corresponding digital signals (vectors) in a baseband processor, using only a single ADC circuit. The method in one embodiment calls for sampling a first one of the analog signals in the ADC circuit during a first time interval to provide a first digital signal, and sampling the other one of the pair of analog signals in the same ADC circuit during a second time interval non-overlapping the first time interval to provide a second digital signal. The two digital output signals are then aligned so as to compensate for a phase difference introduced by the alternating sampling steps.

The alignment can be accomplished by various digital processing techniques, essentially by delaying the two signals by different intervals to bring them into alignment. This is preferably done using digital delay and LPF interpolation circuits.

Additional aspects and advantages of this invention will be apparent from the following detailed description of embodiments thereof, which proceeds with reference to the accompanying drawings.

BRIEF DESCRIPTION OF THE DRAWINGS

FIG. 7 is a simplified schematic diagram of one example of phase correction circuitry in the baseband processor, employing a linear interpolator characterized by $(1+D)/2$.

FIG. 8 is a simplified schematic diagram of another example of phase correction circuitry in the baseband processor, employing an interpolator characterized by $(-1+3D+3D^2-D^3)/4$.

DETAILED DESCRIPTION OF THE EMBODIMENTS

Figure 1:
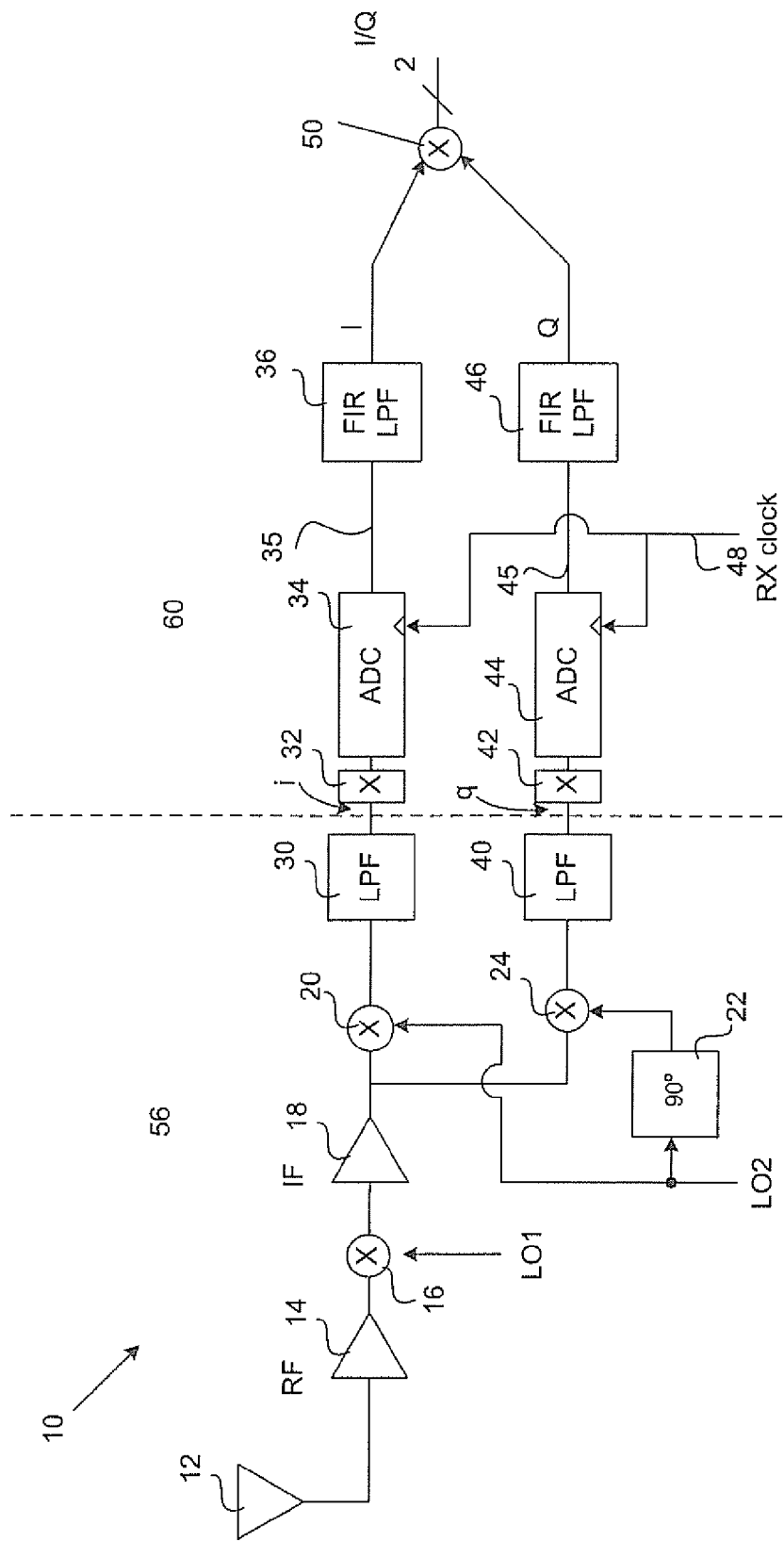
FIG. 1 is a simplified schematic diagram of a known receiver circuit.

The present invention is directed to improvements in receiver circuits generally of the type illustrated in FIG. 1. It is not limited to 2-D modulation, however, but could be used in any multi-dimensional modulation RF communications application. For simplicity, we describe below particular embodiments of the invention, directed to a 2-D (I,Q) modulation application.

As described above with reference to FIG. 1, a typical RF or wireless communications receiver includes RF input, filtering, down-mixing etc. all generally designed to recover the I and Q analog signals. We will refer to such circuitry as the RF portion of the receiver, although it includes IF operations as well. Using this working definition, the RF portion provides the baseband analog signals i, q at its output. The RF portion 56 of the receiver of FIG. 1 is the circuitry generally to the left of the dashed line.

Figure 2:
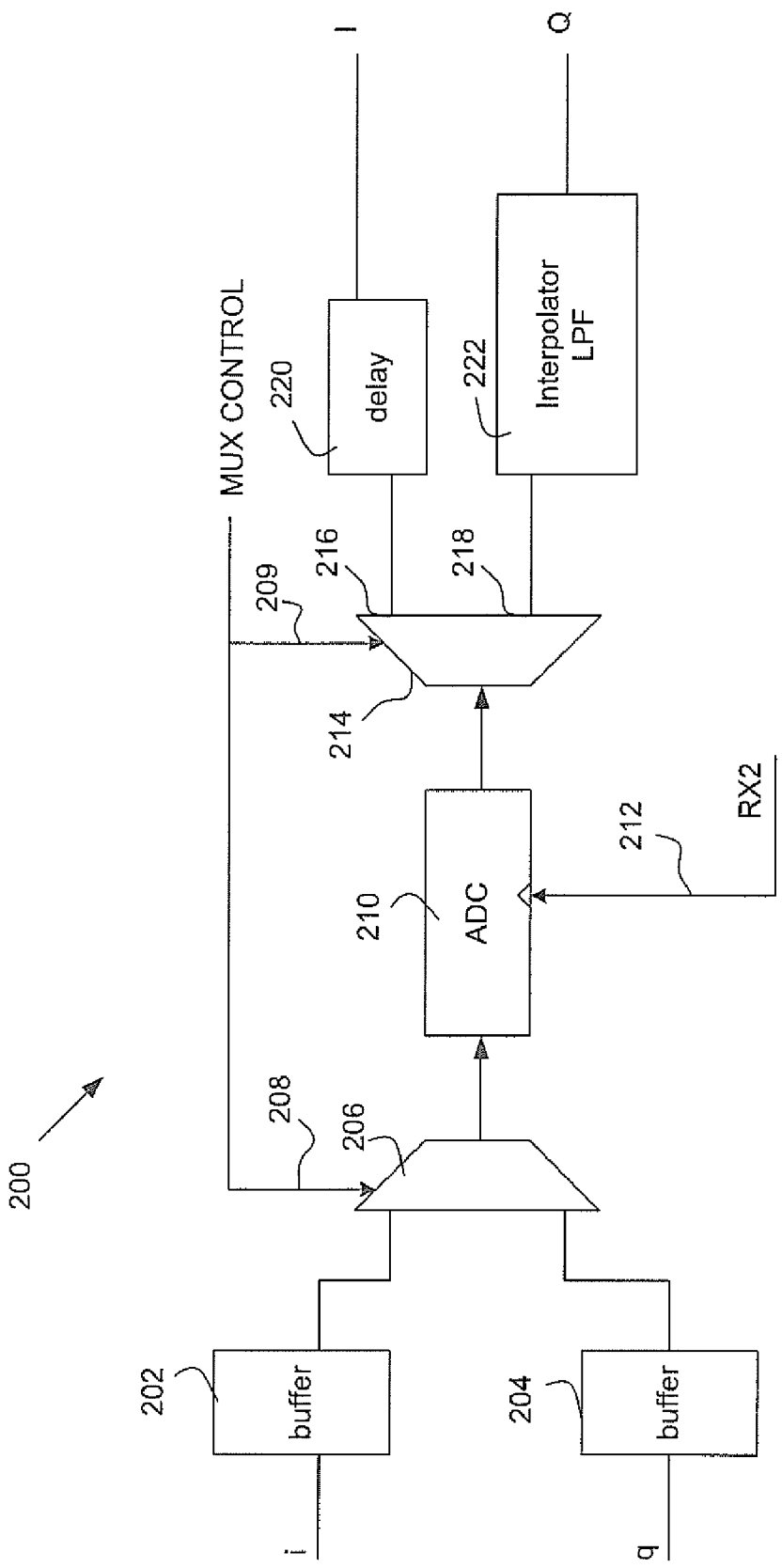
FIG. 2 is a simplified schematic diagram of a baseband processing circuit according to a first embodiment of the invention, for use in a receiver circuit of the general type shown in FIG. 1.

The circuitry 60 on the right side of FIG. 1, including in particular the pair of ADCs, processes the analog baseband signals to recover the original digital data. We will refer to this type of circuitry, generally to the right of dashed line in the illustrative receiver circuitry of FIG. 1, as a baseband processing circuit, or simply "baseband processor". Referring now to FIG. 2, one embodiment of an improved baseband processor in accordance with the present invention is shown. This type of improved baseband processor can be used in combination with various receiver circuits of the general type illustrated in FIG. 1, namely any RF receiver that down-mixes or demodulates received signals so as to recover at least two analog signals that encode digital data symbols. The present invention is not limited to any particular symbol coding.

The task of the new baseband processor of FIG. 2 is essentially to re-create the encoded digital data, through analog to digital conversion, while overcoming the shortcomings of prior art such as those mentioned above. Specifically, the new circuit 200 reduces circuit area significantly by reducing the number of ADCs from two to one. In FIG. 2, the "i" analog signal (corresponding to the output of filter 30 in FIG. 1) is input to a first buffer 202 to provide low output impedance to drive the subsequent ADC. Similarly, the "q" analog signal (corresponding to the output of filter 40 in FIG. 1) is input to a second buffer 204. The outputs of buffers 202,204 are input to respective signal inputs to a first multiplexer 206, a 2:1 multiplexer.

The signal output of multiplexer 206 is input to an ADC circuit 210, which in the present embodiment comprises a flash ADC with 6-bit accuracy although the particular choice of ADC depth is not critical with respect to the present invention. The digital output vector stream, after delayed by several clock cycles due to internal conversion delay, is input to a demultiplexer circuit 214. Details of these individual circuit components, such as the multiplexer and demultiplexer circuits, are omitted as they are well known in the art.

The demultiplexer 214 alternately provides output vector streams at node 216 and node 218. A delay circuit 220 receives digital data from the first output 216 of the demultiplexer, while an interpolator circuit 222 receives digital data from the second output 218 of the demultiplexer 214. (The term "while" in the preceding sentence is not intended literally to imply simultaneity; rather, in present embodiment, data is output from the demultiplexer on alternate phases or clock cycles as more fully explained below.) Finally, the delay circuit 220 and the interpolator 222 provide the recovered I and Q digital data streams, respectively.

Multiplexer 206 and demultiplexer 214 each have a control input 208, 209 respectively. These inputs are driven by a "multiplexer control" signal, which is a periodic clock signal having the same frequency as the clock signal that drives the ADC at clock input 212. The clock signals generally are provided by on-chip PLL circuits or the like (not shown). In the present embodiment, the ADC clock signal 212 (and the multiplexer control clock signals 208, 209) has a frequency that is significantly higher than the clock rates of prior art baseband circuits, such as the RX clock signal of FIG. 1. For example, the known circuit of FIG. 1 may employ a 44 MHz receive clock to drive both ADC's 34 and 44, while one embodiment of the circuit of FIG. 2 uses an 88 MHz signal to clock the single ADC. We will refer to the signal at 212 as the "RX2" clock. Because both the I and Q streams share a single, common ADC circuit, the net result is essentially the same ADC bandwidth as the prior art, while chip area is substantially reduced. It is estimated that the additional overhead of circuits that employ the present invention will amount to only about 10% of the saved chip area that would otherwise be necessary to accommodate a second ADC, as in circuits of the type illustrated in FIG. 1.

In operation of the circuit of FIG. 2, the multiplexer control signal 208 first selects the "i" signal (from buffer 202) and the multiplexer 206 conveys it to the ADC 210 analog input. The ADC samples the input signal during a first cycle. The ADC is driven by the RX2 clock which is synchronized with, and at twice the frequency of the multiplexer control signal. During the next clock cycle, the multiplexer 206 selects the "q" signal (from buffer 204) and conveys it to the ADC signal input. On the next clock cycle, the multiplexer switches back to the first ("i") input signal, and so on, so that the ADC 210 is alternately sampling the two input signals in "ping-pang" fashion. The multiplexer control signal is simply RX2 divided by 2.

Samples from both analog input signals are thus converted to digital form in one ADC 210. (The resulting digital data appears at the ADC output some number of clock cycles after sampling the input, depending on the depth/latency of the ADC pipeline.) The multiplexer control signal or its equivalent also controls the demultiplexer 214 at its control input 209. In other words, the multiplexer and demultiplexer control signals 208, 209 are coordinated such that the demultiplexer 214 steers the ADC digital output to the first output node 216 during a clock period corresponding to input of the "i" signal to the ADC. Thus the "i" data stream digital data is output to the delay element 220. Conversely, the demultiplexer 214 steers the ADC digital output to the second output node 218 during alternate clock periods corresponding to input of the "q" signal to the ADC as described above. Thus the "q" data stream digital data is output to the interpolator element 222. These operations continue responsive to the RX2 clock and control signals described above.

In the embodiment shown in FIG. 2, the ADC 210 is driven at a greater sample rate (clock rate) than in the conventional, two-ADC type of circuit. Because the ADC is shared between the two input signals, a clock frequency of twice that of the circuit of FIG. 1 will yield essentially the same bandwidth as FIG. 1. The particular clock speed for a given application is a matter of design choice, trading off speed vs. power and other considerations. The clock speed is not critical to the invention, as long as it can accommodate analog to digital conversation of the i and q at the desired I and Q sampling rates. The circuits and operations described above not only reduce chip area, but the use of an increased ADC sample rate (clock speed) also improves latency in the ADC.

Figure 4:
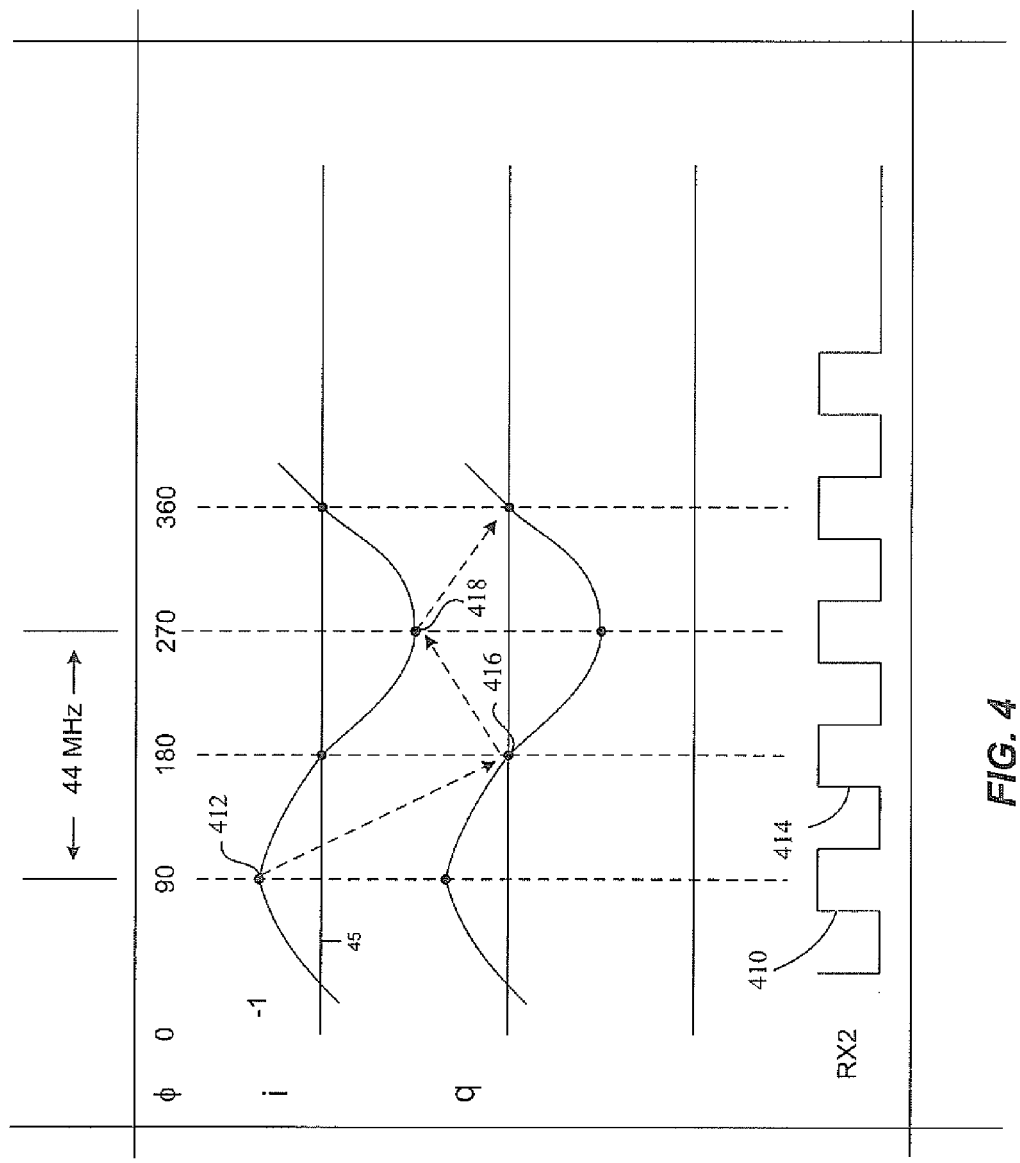
FIG. 4 illustrates a method of sampling a pair of waveforms using only a single ADC circuit consistent with the present invention.

The baseband processor circuits and methodology described thus far with regard to FIG. 2 result in a phase difference between the recovered I and Q data streams. FIG. 4 illustrates this effect. In FIG. 4, signals "i", "q" and ADC Clock are illustrated in a simplified, idealized timing diagram. Assume the ADC samples its input beginning at the rising edge 410 of the clock signal, and assume the i signal is sampled first, at point 412 on the i waveform. On the next clock cycle, rising edge 414, the input multiplexer is switched, and the ADC samples the q waveform at point 416. On the next clock, the multiplexer is switched again, and the ADC samples the i waveform at point 418, and so on. The reader can observe that the q sampling lags behind the i sampling; in other words a phase difference is introduced. That phase difference between the recovered I and Q streams can be corrected in various ways; some examples follow. This embodiment implements the phase correction on the digital data (I and Q), although it alternatively could be done in the analog realm.

Referring again to FIG. 2, the I digital signal is delayed by one-half cycle in a delay element 220. The Q signal is input to an interpolator (low-pass filter) 222. The interpolator is designed to realize $(2k+1)/2$ cycles of delay, in other words 0.5 or 1.5 or 2.5 cycles, etc. This can be done with a simple, symmetric 4-tap LPF with constant coefficients as is known. For example, the LPF can be described by the transfer function $(-1+3D+3D^2-D^3)/4$. The delay element 220 and the LPF 222 bring the I and Q signals into phase alignment for subsequent decoding. In general, after the ADC conversion, one signal is delayed and the other signal filtered by an LPF interpolator to compensate for the phase difference arising from the implementation of a single ADC.

FIG. 7 is a simplified schematic diagram showing one example of phase correction circuitry in the baseband processor in greater detail. This circuit implements a linear interpolator characterized by $(1+D)/2$. In this figure, as well as FIG. 8, CK is a half-rate clock signal in phase with RX2. FIG. 8 is a simplified schematic diagram of another example of phase correction circuitry in the baseband processor; this circuit employing an interpolator characterized by $(-1+3D+3D^2-D^3)/4$.

Figure 3:
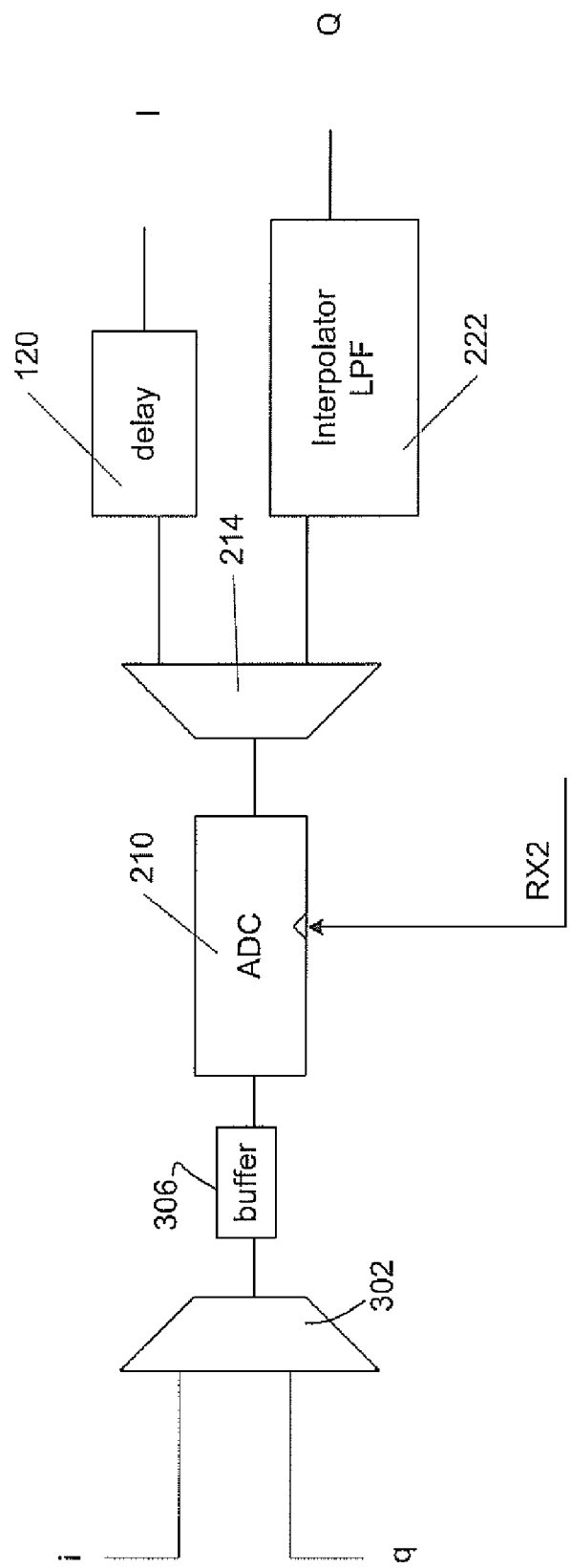
FIG. 3 illustrates a baseband processing circuit according to a second embodiment of the invention.

FIG. 3 illustrates an alternative embodiment of the baseband processor. In FIG. 3, the baseband processor is similar to the circuit of FIG. 2, except as follows. The i and q analog signals are input to a multiplexer 302, without the use of buffers (202, 204 in FIG. 2). Multiplexer 302 still serves to steer these signals, alternately, to the ADC as before. In FIG. 3, however, a buffer 306 is introduced between the multiplexer 302 and the ADC. Various arrangements of buffers can be used as long as they provide adequate drive into the ADC.

Figure 5:
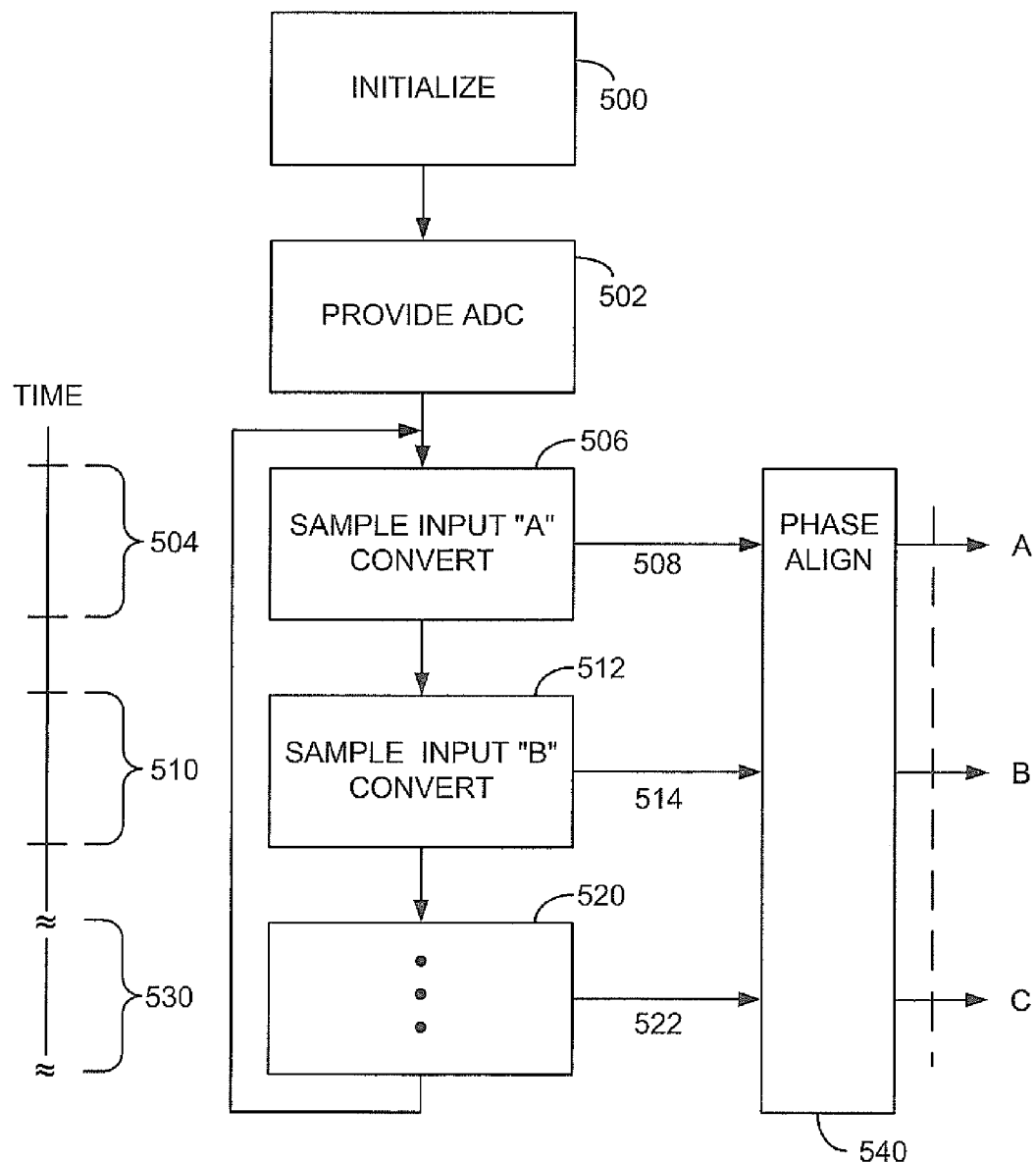
FIG. 5 is a flow diagram illustrating a baseband processing method consistent with the present invention.

FIG. 5 is a flow diagram illustrating a baseband processing method according to the present invention. The methodology can be implemented in a variety of ways, using one or more information processors such as general purpose or special purpose processors, and/or programmable logic as is well known in the art. Referring to FIG. 5, the inventive method can be summarized as directed to concurrently converting a plurality of analog signals having a predetermined phase relationship into corresponding digital signals, while using only a single ADC circuit. The initial step 502 calls for providing a single ADC circuit, as explained above. Next, during a first time interval 504, sampling 506 a first one of the analog signals in the ADC circuit to provide a first digital signal 508. Further, during a second time interval 510 non-overlapping the first time interval, the method calls for sampling 512 a second one of the analog signals in the ADC circuit to provide a second digital signal 514.

In a phase quadrature application, there are only two analog signals to decode, and Q. Other schemes may involve more signals. In the latter case, the method further calls for sampling 520 each remaining analog signal, if any, in the same ADC circuit, so as to provide zero or more additional digital signals 522. These additional sampling steps would be carried out during allocated time slots 530 non-overlapping the previous time intervals.

Next the process calls for aligning the first, second (and any additional digital signals), reference 540, so as to restore the original phase relationship among the corresponding analog signals. These sampling and aligning steps are repeated substantially continuously in response to a periodic clock signal as explained above.

Figure 6:
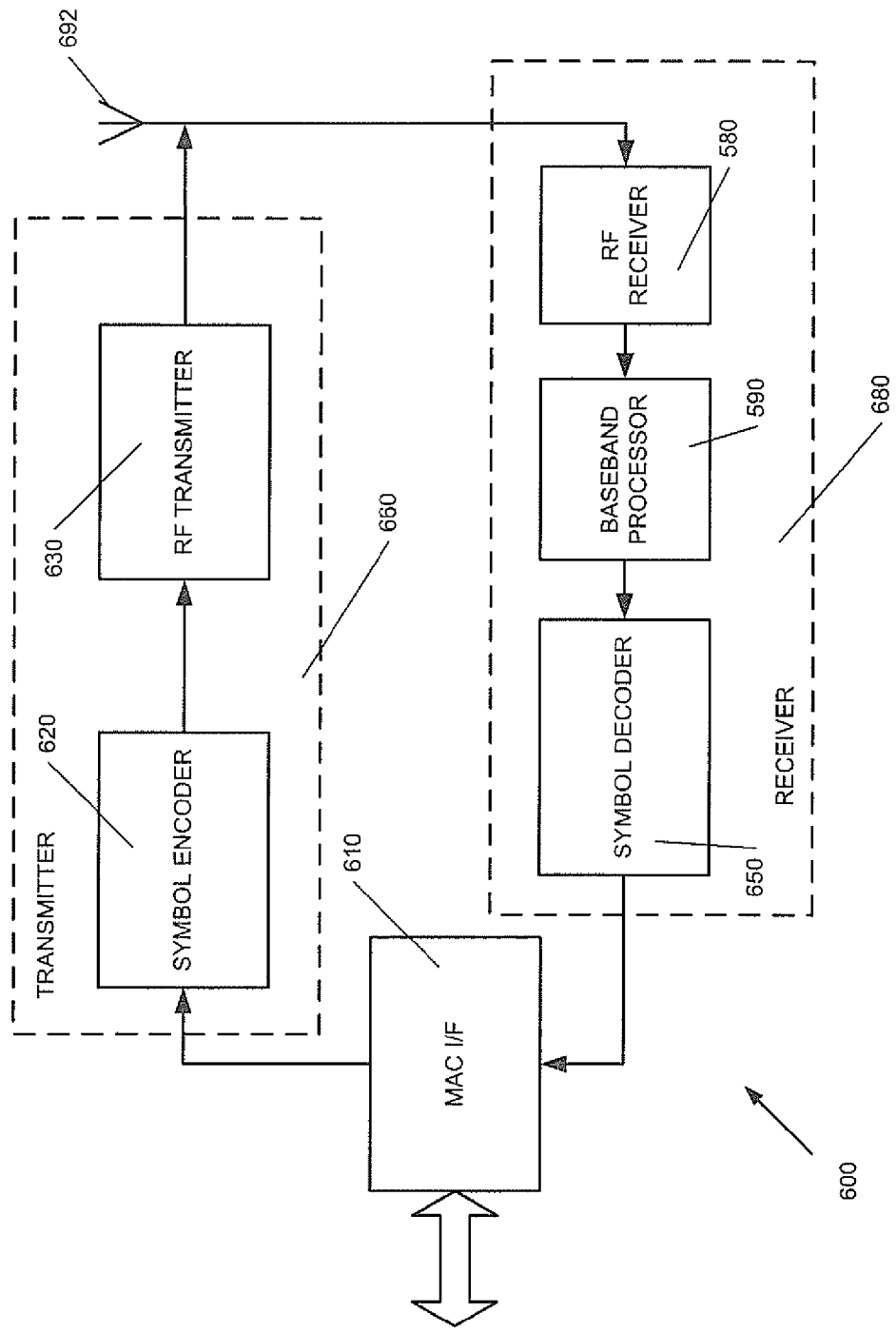
FIG. 6 is a simplified block diagram of a transceiver incorporating a single ADC architecture in accordance with the present invention.

FIG. 6 is a simplified block diagram of an example wireless transceiver 600 incorporating the ADC circuit 200 shown in FIG. 2 as part of the baseband processor 60 within receiver 680. As shown in FIG. 6, in this embodiment the digitized I and Q signals recovered by the ADC circuit 200 of the baseband processor are fed to the symbol decoder 650 to recover the data of interest. Though not required, it should be realized that the I and Q signals typical present data in symbol-encoded form, using orthogonal class modulation techniques such as complementary-code-keying ("CCK") or OFDM modulation specified in IEEE Std. 802.11b (1999) and 802.11a (1999) HIGH-RATE PHY extensions to IEEE/ANSI Std. 802.11 (1999), all of which incorporated herein fully by reference, in order to achieve high-speed transmission yet retain commercially practicable recovery rates.

After symbol-decoding by the symbol decoder 650, the recovered data is sent to a data interface such as MAC layer interface 610 for further operation. As shown in FIG. 3, the transceiver 600 also includes a conventional transmitter 660 to carry out encoding and transmission of outbound data from the MAC interface 610. Though not required as will be appreciated by those of ordinary skill, the embodiment of FIG. 6 depicts the transmitter 660 and receiver 690 sharing a common RF antenna 692.

Though not shown in FIG. 6, the transceiver 600 may form an operational part of a network interface apparatus such as a PC card or network interface card capable of interfacing with the CPU or information processor of an information processing apparatus such as a desktop or laptop computer, and may be integrated within and constitute a part of such information processing apparatus. This network interface apparatus may alternatively form an operational component of a wireless communications access point such as a base station as will be appreciated by those ordinarily skilled in the art.

It will be obvious to those having skill in the art that many changes may be made to the details of the above-described embodiments of this invention without departing from the underlying principles thereof. The scope of the present invention should, therefore, be determined only by the following claims.

What is claimed is:

1. A method, comprising:
   during a first time interval, sampling a first analog signal of a pair of analog signals in an analog to digital converter to provide a first digital signal;
   during a second time interval non-overlapping the first time interval, sampling a second analog signal of the pair of analog signals in the analog to digital converter to provide a second digital signal, wherein the pair of analog signals have a predetermined phase relationship; and
   aligning the first digital signal and the second digital signal so as to compensate for a phase difference introduced by the sampling of the first analog signal and the second analog signal respectively during the first time interval and the second time interval, wherein the aligning of the first digital signal and the second digital signal comprises
   delaying one of the first digital signal and the second digital signal, and
   interpolating the other one of the first digital signal and the second digital signal to compensate for the phase difference introduced by the sampling during the first time interval and the second time interval, wherein interpolating the other one of the first digital signal and the second digital signal realizes a delay of (2k+1)/2 clock cycles, where k is an integer.

2. The method of claim 1, further comprising buffering the pair of analog signals in a buffer prior to sampling during the first time interval and the second time interval.

3. The method of claim 1, further comprising buffering the pair of analog signals in a first buffer and a second buffer, respectively, prior to sampling during the first time interval and the second time interval.

4. The method of claim 1, further comprising selecting one of the pair of analog signals using a multiplexer.

5. The method of claim 4, further comprising selecting the one of the pair of analog signals in response to a multiplexer control signal.

6. The method of claim 4, further comprising synchronizing the multiplexer to the analog to digital converter.

7. The method of claim 4, further comprising selectively outputting the first digital signal and the second digital signal using a demultiplexer.

8. The method of claim 7, further comprising selectively outputting the first digital signal and the second digital signal in response to a demultiplexer control signal.

9. The method of claim 7, further comprising synchronizing the demultiplexer to the analog to digital converter.

10. The method of claim 1, further comprising driving the analog to digital converter at a sample rate using a sampling clock circuit.

11. The method of claim 1, wherein the analog to digital converter is pipelined.

12. The method of claim 1, further comprising transmitting the first digital signal and the second digital signal.

\* \* \* \* \*